(12) United States Patent
Youssef et al.

(10) Patent No.: US 11,139,732 B2
(45) Date of Patent: Oct. 5, 2021

(54) POWER ELECTRONIC MODULE

(71) Applicant: SAFRAN, Paris (FR)

(72) Inventors: Toni Youssef, Moissy-Cramayel (FR); Stéphane Joseph Azzopardi, Moissy-Cramayel (FR); Rabih Khazaka, Moissy-Cramayel (FR); Donatien Henri Edouard Martineau, Moissy-Cramayel (FR)

(73) Assignee: SAFRAN, Paris (FR)

(*) Notice: Subject to any disclaimer, the term of this patent is extended or adjusted under 35 U.S.C. 154(b) by 0 days.

(21) Appl. No.: 16/766,059

(22) PCT Filed: Nov. 20, 2018

(86) PCT No.: PCT/FR2018/052922
§ 371 (c)(1),
(2) Date: May 21, 2020

(87) PCT Pub. No.: WO2019/102135
PCT Pub. Date: May 31, 2019

(65) Prior Publication Data
US 2020/0336061 A1 Oct. 22, 2020

(30) Foreign Application Priority Data
Nov. 22, 2017 (FR) ...................... 1761065

(51) Int. Cl.
H02M 1/32 (2007.01)
H05K 7/20 (2006.01)

(52) U.S. Cl.
CPC .......... H02M 1/32 (2013.01); H05K 7/20409 (2013.01); H02M 1/327 (2021.05)

(58) Field of Classification Search
CPC ............ G01D 1/00; G01K 15/00; G01K 7/00; G01K 7/021; G01K 7/16; G05D 23/00; G05D 23/2418; H01L 2224/00; H01L 2224/29191; H01L 2224/29193; H01L 2224/32225; H01L 23/00; H01L 23/4006; H01L 23/49811; H01L 24/00;
(Continued)

(56) References Cited

U.S. PATENT DOCUMENTS

| 6,507,108 B1 | 1/2003 | Lindemann et al. |
| 2010/0284155 A1 | 11/2010 | Stolze et al. |
| 2014/0160691 A1* | 6/2014 | Sohn ................... H01L 23/4006 361/736 |

FOREIGN PATENT DOCUMENTS

CN 1354514 A 6/2002

OTHER PUBLICATIONS

Official Communication dated Aug. 9, 2018, in corresponding FR Application No. 1761065 (7 pages).
(Continued)

Primary Examiner — Lincoln D Donovan
Assistant Examiner — Dave Mattison
(74) Attorney, Agent, or Firm — Bookoff McAndrews, PLLC

(57) ABSTRACT

Power electronic module comprising a plurality of semiconductor power electronic components electrically connected to an electrical support, and a cooling device in thermal contact with each component, each component being present between the electrical support and the cooling device and being mounted on the electrical support via at least one electrically conductive spring element.

8 Claims, 4 Drawing Sheets

(58) Field of Classification Search
CPC ......... H01L 24/29; H01L 24/32; H01L 24/72;
H01L 25/00; H01L 25/072; H02M 1/00;
H02M 1/32; H02M 2001/00; H02M
2001/327; H05K 7/00; H05K 7/1432;
H05K 7/20409; H05K 7/2049; H05K
7/209
USPC ......................................................... 307/651
See application file for complete search history.

(56) References Cited

OTHER PUBLICATIONS

International Search Report issued in International Application No. PCT/FR2018/052922 dated Feb. 26, 2019, with English translation (4 pages).

\* cited by examiner

POWER ELECTRONIC MODULE

CROSS-REFERENCE TO RELATED APPLICATIONS

This application is the U.S. national phase entry under 35 U.S.C. § 371 of International Application No. PCT/FR2018/052922, filed on Nov. 20, 2018, which claims priority to French Patent Application No. 1761065, filed on Nov. 22, 2017.

BACKGROUND OF THE INVENTION

The invention relates to the production of a power electronic module having high reliability and easy maintainability, in particular within the context of aeronautical applications.

FIG. 1 illustrates a structure of power electronic module 100 produced according to the prior art. The power electronic module 100 has a substrate 101 made of ceramic material and formed of an electrically insulating layer 101a arranged between two metal layers 101b, 101c. The metal layers 101b, 101c can be assembled with the electrically insulating layer 101a according to various techniques, for example by AMB (Active Metal Brazing), by DBC (Direct Bonded Copper), or even by DBA (Direct Bonded Aluminum). The upper metal layer 101b of the substrate 101 forms a power circuit on which one or more power semiconductor component(s) 102 is/are assembled. The power semiconductor components 102 are assembled on the metal layer 101b by means of an interconnection seal 103. The latter ensures mechanical, electrical and thermal contact between the components 102 and the metal layer 101b. The power semiconductor components 102 are further connected to the power circuit, formed by the layer 101b, by metal wiring cables 104.

Because of their imperfections, the power semiconductor components 102 are the site of losses by Joule effect and represent a significant source of heat. Thus, the lower metal layer 101c of the substrate 101 is transferred via an interconnection seal 105 onto a metal flange 106, the latter being used to spread the heat flux and ensure a thermal connection with a metal heat sink 108. The interconnection seal 105 has the function of ensuring mechanical, electrical and thermal contact between the metal layer 101c and the metal flange 106. The flange 106 is itself assembled via a layer 107 made of thermal interface material with the metal heat sink 108. The layer 107 is, for example, thermal grease, an elastomeric film, or a layer of phase-change materials. The layer 107 allows reducing the thermal contact resistance between the flange 106 and the heat sink 108 in order to ensure better discharge of the heat flux. By way of example, the heat sink 108 is provided with fins 109 making it possible to minimize its thermal resistance, a coolant such as air passing through the fins 109.

The power electronic module 100 described above nevertheless has several drawbacks.

First, the different layers 101a, 101b, 101c of the substrate 101, as well as the flange 106, have different coefficients of thermal expansion therebetween making the module 100 sensitive to the phenomenon of thermal fatigue. During the thermal cycles to which the power electronic module 100 is subjected, cracks may thus appear in the electrically insulating layer 101a of the substrate 101, in the electrical interconnection seals 103, 105, and/or in the connection between the metal wiring cables 104 and the layer 101b. These risks of cracks therefore affect the reliability of the module 100. In addition, the use of metal wiring cables 104 induces the presence of parasitic inductances.

In addition, the transfer of the power semiconductor component 102 by the interconnection seal 103, as well as its connection by the metal wiring cables 104 limit the repair of the module 100. The replacement of a power semiconductor component 102 turns out to be indeed very binding. This requires in particular removing the interconnection seal 103, de-wiring the component 102, then repeating the connection of a new component by metal wiring cables 104. In the case where these actions are possible, multiple steps are thus required, implying a time and a high cost of replacement of the component, for a random success. The power electronic module 100 described above is therefore very rarely maintainable, and a common solution consists in replacing the module 100 as a whole in the event of failure of a component 102.

Furthermore, the presence of the metal wiring cables 104 for connecting each component 102 limits, given the complexity of assembly, the addition of additional components or the replacement of a specific component. The architecture of the power electronic module 100 therefore limits the addition of additional components and therefore the power ranges to which the module 100 can apply.

Another structure of a power electronic module known from the prior art relates to a pressed module, commonly designated under the name "Press-Pack". In this architecture, one or more power semiconductor component(s) is/are in the form of bare chips directly sandwiched between two substrate layers. This second architecture has several advantages compared to the previously described one. Indeed, it allows in particular dispensing with of wiring cables or brazes, is not very sensitive to thermal fatigue and allows reducing parasitic inductances. However, the "Press-Pack"-type architectures remain limited to the high power components (e.g. thyristors, Gate Turn-Off Thyristors GTO, Insulated Gate Bipolar Transistors IGBT). Furthermore, the fact of disposing the power semiconductor components in a sandwich-like manner between two layers of substrates can lead to the observation of undesirable piezo-resistive effects on these components. In addition, the mounting of the components turns out to be delicate and involves high manufacturing costs. Such a solution therefore also turns out to be limited.

It is therefore desirable to produce a reliable power electronic module, not very sensitive to thermal fatigue, easily maintainable, simplifying the addition of new components, having a cooling system simple to implement, having no undesirable piezo-resistive effects, applicable to any power range, with a reduced manufacturing cost and a minimum of parasitic inductances.

OBJECT AND SUMMARY OF THE INVENTION

The present invention aims at overcoming the aforementioned drawbacks.

To this end, the invention proposes a power electronic module comprising a plurality of semiconductor power electronic components electrically connected to an electrical support, and a cooling device in thermal contact with each component, each component being present between the electrical support and the cooling device, each component being further mounted on the electrical support via at least one electrically conductive spring element.

The power electronic module described above has the following advantages. The spring element is retractable and allows the electrical connection of the component with the electrical support. In addition, the spring element exerts a controlled pressure on the component, thereby maintaining it fixed. It is thus possible, with regard to the state of the art, to dispense with the use of metal wiring cables as well as the transfer of the component to interconnection seals, which would involve parasitic inductances and risks of failures. The reliability of the power electronic module is therefore enhanced. Furthermore, the electrical contact between each component and the electrical support is established by simple bearing of the components on at least one spring element. The mechanical and electrical contact between each component and a spring element is maintained by a bearing force exerted by the cooling device on each component. Thus, in the event of failure of a specific component, the module is easily demountable, the failed component accessible and replaceable by simple withdrawal. The module thus has a high maintainability. This high maintainability of the module authorizes the addition of additional components or the specific replacement of component(s) without involving complexity of assembly, thus giving it modular natures. It is thus possible to target in terms of applications various power ranges, in particular the low and/or average power applications.

In one exemplary embodiment, each component comprises a first side disposed facing the electrical support, said first side including electrodes, and said at least one spring element establishing an electrical connection between at least one of the electrodes and the electrical support.

In one exemplary embodiment, each component comprises a second side opposite the first side and the module further comprises a thermal interface disposed between the cooling device and a second side of each component.

In one exemplary embodiment, said at least one spring element establishing an electrical connection between said at least one of the electrodes and the electrical support comprises a first end brazed to the electrical support.

In one exemplary embodiment, said at least one spring element comprises a second end bearing on said at least one of the electrodes.

In one exemplary embodiment, each component is packaged in an electronic surface-mounted package.

In one exemplary embodiment, a positioning frame is disposed between the electrical support and the cooling device and comprises through orifices each configured to receive respectively a component and at least one spring element.

In one exemplary embodiment, said at least one component is a power transistor or a power diode.

In one exemplary embodiment, the module summarized above comprises a power converter formed by a plurality of components.

BRIEF DESCRIPTION OF THE DRAWINGS

Other characteristics and advantages of the invention will emerge from the following description of particular embodiments of the invention, given by way of nonlimiting examples, with reference to the appended drawings, wherein.

DETAILED DESCRIPTION OF EMBODIMENTS

Figure 1:
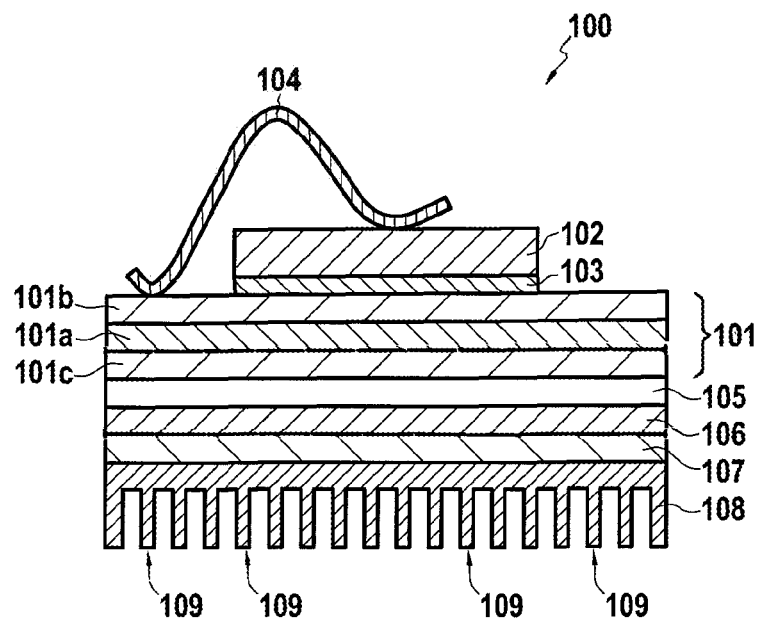
FIG. 1 is a sectional view of a power electronic module produced according to the state of the art.
Figure 2:
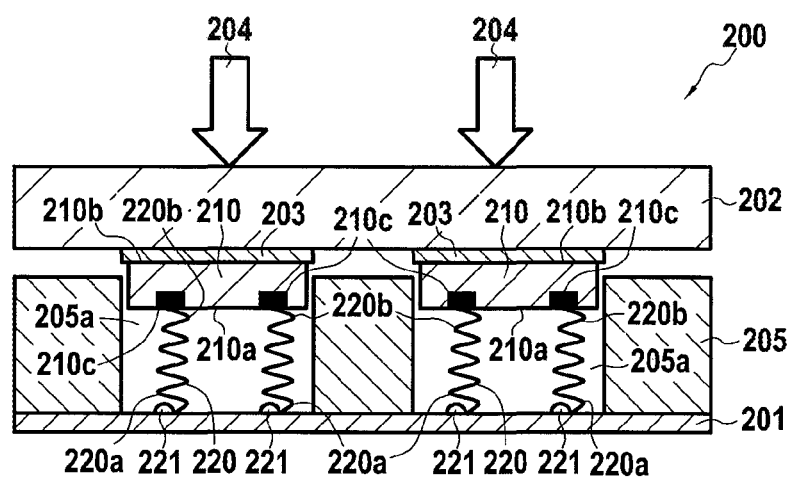
FIG. 2 is a sectional view of a power electronic module produced according to the invention.

FIG. 2 illustrates a power electronic module 200 according to the invention. The module 200 comprises one or more power electronic component(s) 210 electrically connected to an electrical support 201. Two components 210 are here illustrated by way of example, quite a different number of components can be envisaged. Each power electronic component 210 is a semiconductor power component, either a transistor or a diode. A semiconductor power electronic component 210 is for example a JFET (Junction Field Effect Transistor), an insulated gate field effect transistor MOSFET (Metal Oxide Semiconductor Field Effect Transistor), a heterostructure electron transistor HEMT (High Electron Mobility Transistor), a PIN diode (Positive Intrinsic Negative diode) or a Schottky diode.

The electrical support 201 is, by way of example, a multilayer substrate. The multilayer substrate may, for example, have a conductive layer with a printed circuit comprising electrically conductive tracks facing the component(s) 210, an intermediate conductive layer for the control of the components 210 (ex: to control the gate voltage of a transistor) and a conductive layer for the electric polarization of the components 210, the conductive layers being separated by means of insulating layers.

Each component 210 is electrically connected to the electrical support 201 by means of electrically conductive spring elements 220. More specifically, each component 210 has, on a first side 210a, electrodes 210c facing the electrical support 201. Each electrode 210c can be electrically connected by one or more spring element(s) 220 to the electrical support 201. The spring elements 220 are retractable and allow passage of a current with low resistivity, typically from 10 to 15A per connector depending on the model. A first end 220a of each spring element 220 is fixed to the electrical support 201. In the example illustrated, each first end 220a of each spring element 220 is connected to the electrical support 201 by means of a braze 221. Each spring element 220 further comprises a second free end 220b bearing via a restoring force on at least one electrode 210c of a component 210, thus establishing an electrical contact between the component 210 and the electrical support 201. In other words, each second end 220b is not fixed to the component 210, a simple bearing between the component 210 and the second end 220b making it possible to ensure the electrical connection of the component 210 to the electrical support 201.

In the examples illustrated in FIGS. 2 and 4B to 4D, each electrically conductive spring element 220 is a spring contact connector. Such a type of connector is in particular provided by the company Smiths Interconnect®. However, any electrically conductive and mechanically deformable element able to exert a mechanical restoring force on the component 210 can be used as a spring element 220.

Each semiconductor power electronic component 210 has a second side 210b opposite the first side 210a. The second side 210b of each component 210 is in thermal contact with a cooling device 202. Each component 210 is therefore present between the electrical support 201 and the cooling device 202. The cooling device 202 is, by way of example, a heat sink provided with fins through which a coolant such as air passes. A thermal interface 203 is disposed between each second side 210b and the cooling device 202 in order to improve the cooling of each component 210. The layer 203 is for example thermal grease, an elastomeric film, or even a layer of phase-change materials making it possible to reduce the thermal contact resistance between each second side 210b and the cooling device 202.

The cooling device 202 exerts a mechanical bearing force on the second side 210b of each component 210, so as to indirectly maintain the bearing of the first side 210a of each component 210 against a second end 220b of a spring element 220.

In order to guarantee good electrical contact between each component 210 and the electrical support 201, and in order to ensure good thermal contact between each component 210 and the cooling device 202, mechanical pressure means 204 complete the mechanical force exerted by the cooling device 202 on the components 210.

Furthermore, in order to guarantee good positioning of the components 210 on the spring elements 220, a positioning frame 205 is disposed between the electrical support 201 and the cooling device 202. The positioning frame 205 comprises one or more through orifice(s) 205a. Each through orifice 205a is arranged in the positioning frame 205 to receive a component 210 as well as the spring element(s) 220 electrically connecting the component 210 to the electrical support 201.

Preferably, in order to optimize the electrical contact between the electrodes present on the first side 210a of each component 210 and the spring element(s) 220, each component is in the form of a SiP (System in Package), that is to say, is packaged in a surface-mounted package. This packaging gives the components a positioning of the electrodes on only one side and easy handling by the user. The packaged components 210 are by way of example silicon JFET transistors, Gallium nitride GaN HEMT transistors and/or silicon MOSFET transistors comprising a control circuit.

The power electronic module 200 described above can be implemented for low and/or average power applications, in particular for aeronautical applications. For example, various power electronic modules 200 can perform power conversion functions used for the electrification of the non-propulsion systems of an aircraft. These functions can in particular cover the power supply of the main network of the aircraft for all types of power conversions: alternating to direct (AC/DC), direct to alternating (DC/AC), alternating to alternating (AC/AC) or direct to direct (DC/DC).

Figure 3:
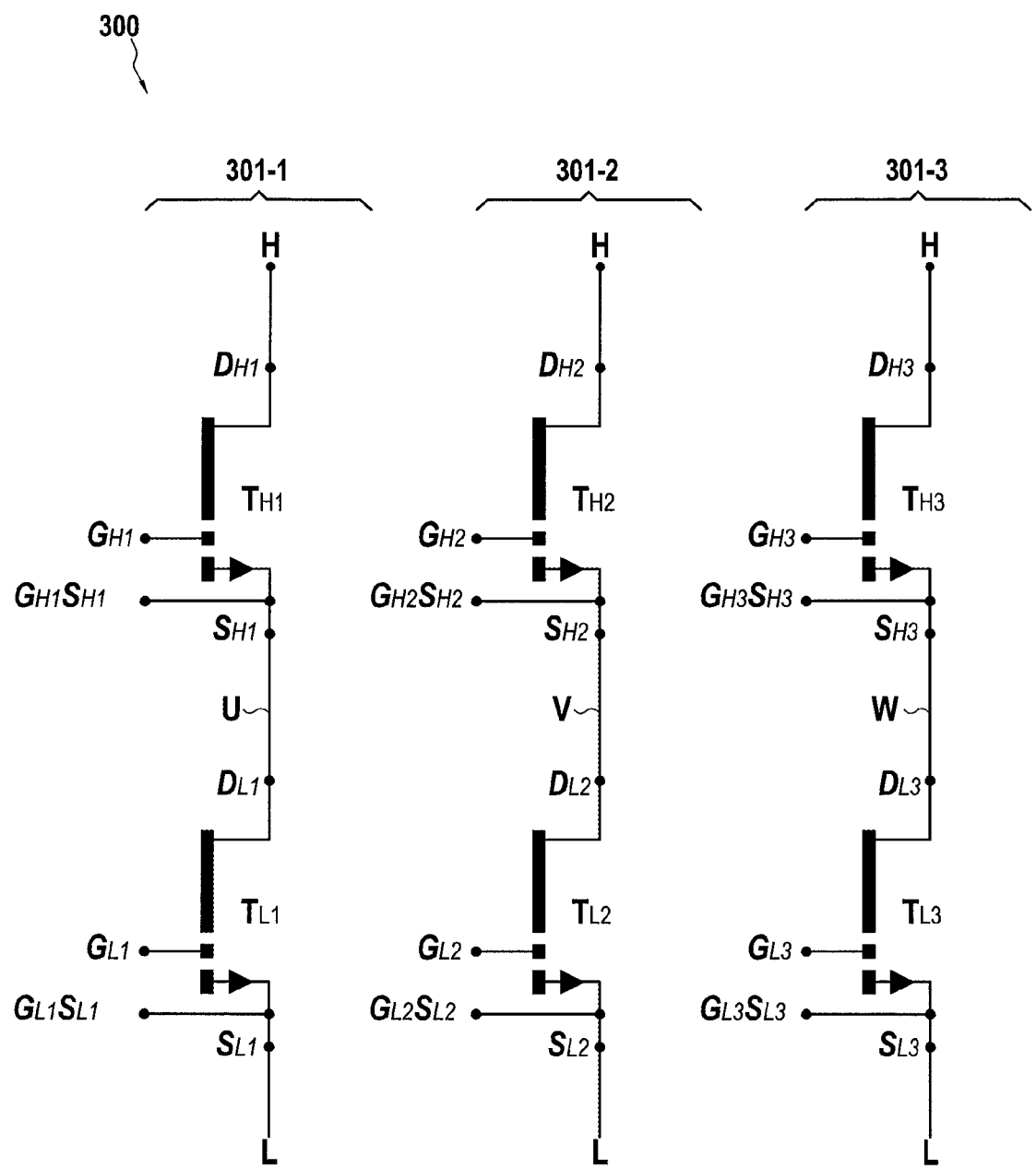
FIG. 3 illustrates an example of an electronic circuit that can be implemented by the power electronic module produced according to the invention.

FIG. 3 illustrates an example of an electronic function that can be performed by the power electronic module 200. The electronic circuit illustrated in this figure has the function of converting DC energy into AC energy via a three-phase inverter 300. The three-phase inverter 300 consists of three single-phase inverter arms 301i, with i=1, 2 or 3, without outer freewheeling diode. Each inverter arm 301i combines two transistors THi and TLi as electronic semiconductor power components 210. In this example, the transistors THi and TLi are Gallium Nitride HEMT transistors and comprise three electrodes: a drain, a gate and a source. The freewheeling function is ensured by reverse conduction of the electronic semiconductor power component 210. However, any other type of semiconductor power component, which may have another number of electrodes or the like, can be used, by adding if necessary a component acting as a freewheeling diode.

Each inverter arm 301i is here consisting of:
an electrode H which carries the high potential of a power bus and which is connected to the drain DHi of the transistor THi,
an electrode GHi which is the gate of the transistor THi, corresponding to the control electrode,
an electrode GHiSHi, which corresponds to the reference potential of the control signal applied to the gate GHi. The electrode GHiSHi is connected to an electrode SHi which is the source of the transistor THi,
an electrode U, V or W carrying the potential of the charge, that is to say the outlet of the inverter arm 301i. This electrode is connected to the source SHi of the transistor THi and to the drain DLi of the transistor TLi,
an electrode GLi, which is the gate of the transistor TLi, corresponding to the control electrode,
an electrode GLiSLi, which corresponds to the reference potential of the control signal applied to the gate GLi, which is connected to the electrode SLi,
an electrode L which carries the low potential of a power bus and which is connected to the source SLi of the transistor TLi.

The three inverter arms 301i thus grouped together allow performing a three-phase inverter function 300 for a DC/AC power conversion.

Steps of assembling a power electronic module 200 producing the electronic circuit described above are illustrated in FIGS. 4A to 4E.

Figure 4A:
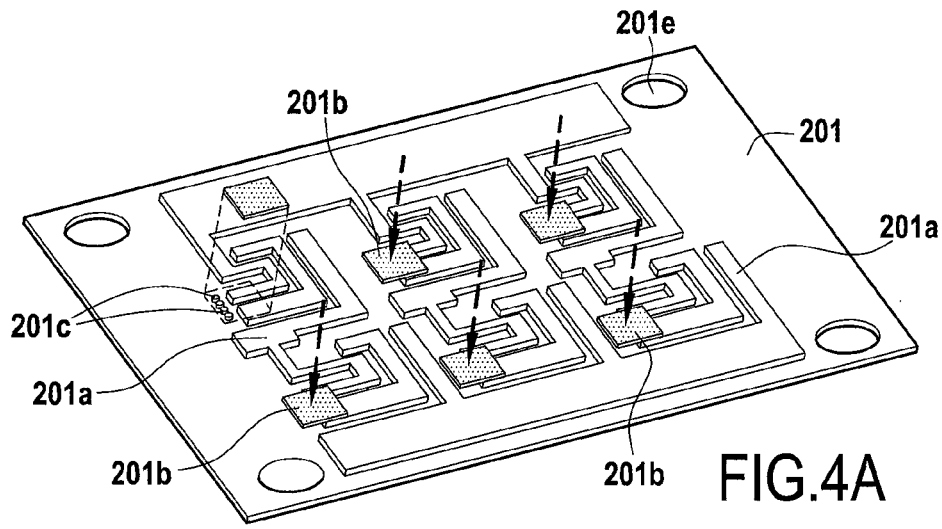
FIGS. 4A to 4E illustrate perspective views corresponding to steps of assembling the power electronic module according to the invention.

In FIG. 4A, an electrical support 201 is manufactured beforehand in order to ensure electrical connection and insulation functions. The electrical support 201 is, for example, a metallized ceramic substrate (e.g. Direct Bonded Copper DBC, or by Direct Bonded Aluminum DBA), an insulated metal substrate (IMS) or a printed circuit board (PCB).

In the example illustrated, the electrical support 201 is a multilayer printed circuit, having three metal layers (e.g. made of copper or any other conductive material), each metal layer being separated by an insulating layer.

A first metal layer comprises conductive tracks 201a intended to route the low and high potentials of bus L, H and connect the electrodes SHi, DLi of the transistors THi and TLi. As can be seen in FIG. 4A, the first metal layer is disposed on the surface of an insulating layer, corresponding in this figure to the visible side of the electrical support 201.

A second metal layer, not visible, is buried in the electrical support 201 and has the function of routing the control signals of the transistors THi and TLi. The first and second metal layers being separated by an insulating layer, metallized holes (vias) passing through the insulating layer make the electrical connection between the first and second metal layers. In the example illustrated in FIG. 4A, the vias are in the form of studs 201c to which control circuits 201b (Drivers) are electrically and mechanically (e.g. by brazing) connected (dotted arrows). The control circuits 201b are also electrically and mechanically connected to the conductive tracks 201a, thus making it possible to communicate the control signals coming from the second metal layer to the control electrodes of the transistors THi and TLi.

A third metal layer, not visible, is separated from the second layer by a first insulating layer, and from the outside of the electrical support 201 by a second insulating layer. This second insulating layer corresponds to the visible side of the electrical support 201 illustrated in FIG. 5. The third metal layer recovers by means of metallized holes (vias) passing through the various insulating layers the outlets U, V and W of the transistors THi and TLi in order to connect them to the external environment.

Figure 5:
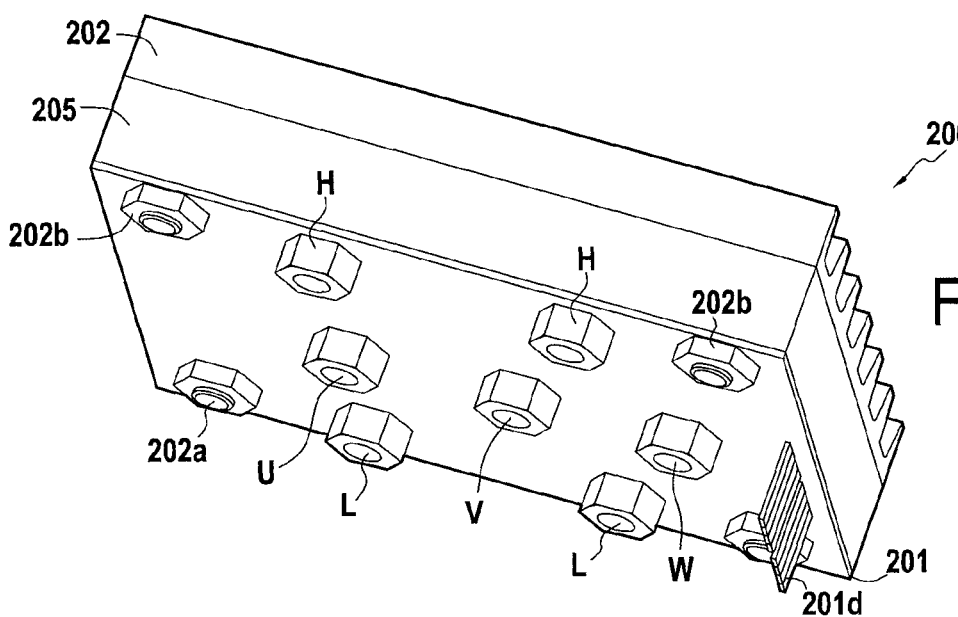
FIG. 5 illustrates a perspective view, after assembly, of the power electronic module according to the invention.

The third metal layer further comprises a low-power comb connector 201d, visible in FIG. 5. This comb connector 201d also constitutes an electrically conductive via between the second and third metal layers, and makes it possible to route from the outside of the electrical support 201 towards the second metal layer the control signals intended for the transistors THi and TLi. As explained above, the control signals are then transmitted by means of electrically conductive vias, such as the studs 201c, to the various control circuits 201b, and from each control circuit 201b to an associated transistor.

Figure 4B:
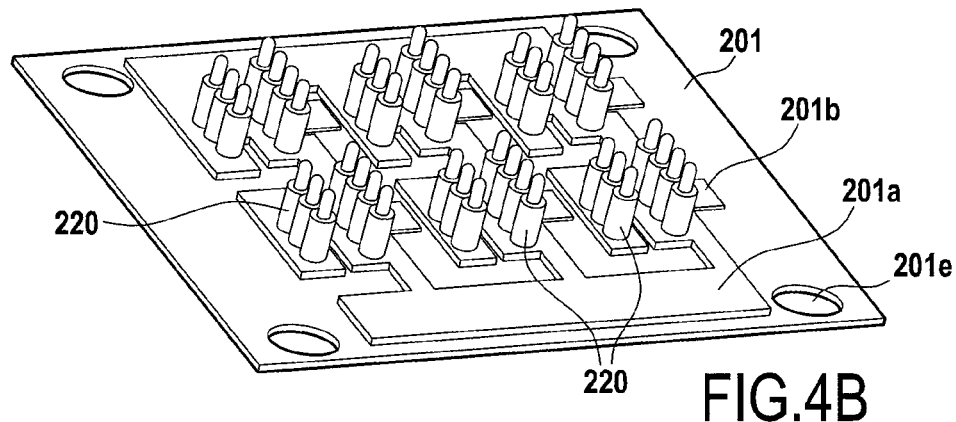

As illustrated in FIG. 4B, spring elements 220 are then fixed on the first layer of the electrical support 201 so as to establish mechanical and electrical contact with the conductive tracks of the PCB. The spring elements 220 can be electrically and mechanically connected to the electrical support 201 by brazing, gluing, sintering, forced mechanical insertion, or any other fixing means. In the example illustrated, the connectors are brazed on the conductive tracks 201a and on the control circuits 201b. Depending on the spacing of the electrodes of the transistors THi and TLi, several spring elements 220 may possibly be disposed so as to be simultaneously facing the same electrode, thus optimizing the electrical contact with this electrode. Thus, in the example illustrated for the transistors THi and TLi:
- two spring elements 220 are disposed so as to be simultaneously facing an electrode SHi or SLi,
- a spring element 220 is disposed so as to be facing an electrode GHi, GLi, GHiSHi or GLiSLi,
- three spring elements 220 are disposed so as to face simultaneously an electrode DHi or DLi.

Figure 4C:
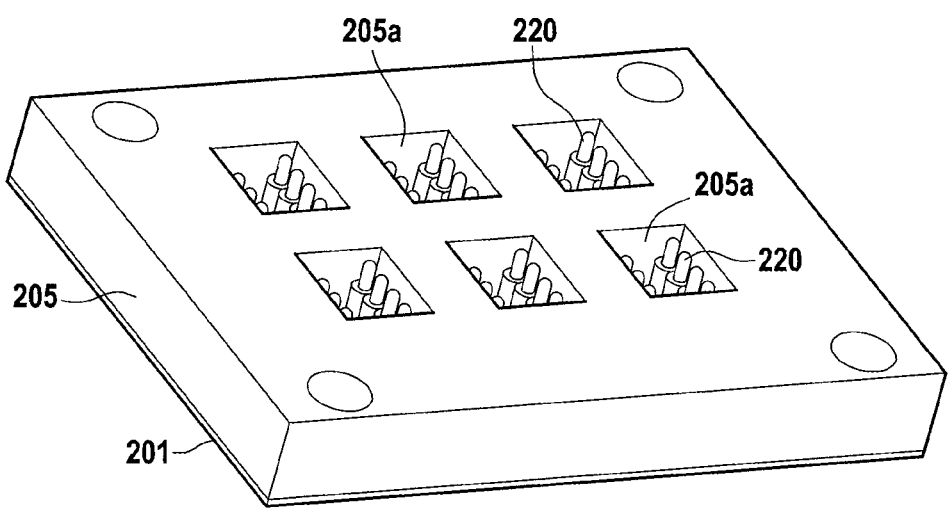
Figure 4D:
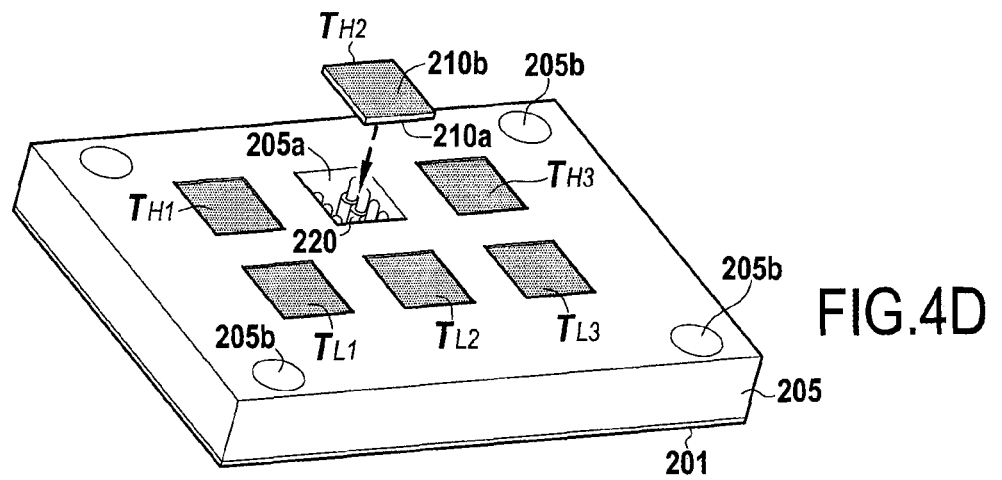

A positioning frame 205 is then disposed on the electrical support 201. As can be seen in FIG. 4C, orifices 205a have been previously arranged therein in order to allow the passage of the spring elements 220. Each orifice 205a is intended to receive a component 210, here a transistor THi or TLi, thus serving as a guide for the transistors THi, TLi upon their bearing on the spring elements 220. The transistors THi, TLi are then each positioned in an orifice 205 and bear on their respective spring elements 220 (see FIG. 4D). More specifically, the electrodes of each first side 210a of the transistors THi, TLi are positioned facing their respective spring elements 220, establishing by bearing thereon a mechanical and electrical contact. The second side 210b of each transistor THi, TLi then faces the outside of the orifice 205a, this second side 210b being intended to be cooled.

A cooling device 202 is then positioned on the positioning frame 205 so as to exert pressure on each second side 210b of the transistors THi or TLi. This pressure allows both:
- exerting a bearing force that can compensate, if necessary, for the restoring force exerted by the spring elements 220 on each transistor THi, TLi. The electrical contacts between the transistors and the spring elements 220 are thus optimized. However, the spring elements 220 can be configured to exert a controlled pressure on each transistor THi, TLi, making it possible to maintain them fixed in the absence of the bearing force of the cooling device 202,
- maintaining mechanical contact with the second side 210b of each transistor THi, TLi, so as to cool it.

Various mechanical pressure means can be envisaged in order to maintain and/or complete the pressure exerted by the cooling device 202 on the components. Thus in FIG. 4E, a set of screws 202a and nuts 202b allow fixing the cooling device 202 through holes 205b, 201e arranged in the cooling device 202, in the cooling frame 202 and in the electrical support 201. Nevertheless, other fixing means can be envisaged, for example a fixing device by clipping. A thermal interface is placed between each transistor THi, TLi and the cooling device 202 in order to improve the cooling of each transistor.

Figure 4E:
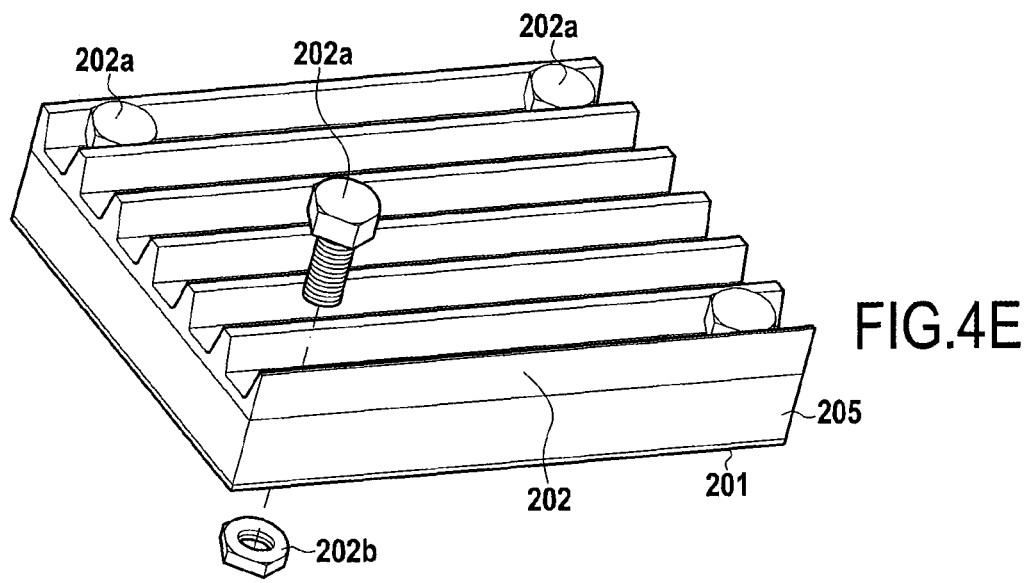

FIG. 5 is a bottom view of FIG. 4E, illustrating the power electronic module 200 obtained after assembly. The presence of connectors is in particular observed, allowing an electrical connection to the outlets U, V, W of the inverter arms 301i, to the low and high potentials of bus L, H, as well as the comb connector 201d for the control of the transistors THi, TLi.

The power electronic module 200 described above has the following advantages. The electrodes 210c of each component 210 are all oriented along the same side, namely the first side 210a, while the second side 210b of each component 210 is intended for the cooling of the component. The spring elements 220 allow the electrical connection of the electrodes 210c with the electrical support 201 by exerting a controlled pressure on the components 210, thereby maintaining them fixed. It is thus possible, with regard to the state of the art, to dispense with the use of metal wiring cables 104 as well as the transfer of the components to interconnection seals. It is thus possible to reduce the parasitic inductances and to dispense with the risks of failures related to the cables and seals which can be observed during the various thermal cycles. The reliability of the power electronic module 200 is therefore enhanced.

Furthermore, the electrical contact between each component 210 and the electrical support 201 is established by simple bearing of the electrodes 210c of the components 210 on the spring elements 220. The mechanical and electrical contact between the components 210 and the spring elements 220 is completed by a bearing force exerted by the cooling device 202 on the second side 210b of each component 210. Thus, in the event of failure of a specific component, the module 200 is easily demountable, the failed component is accessible and replaceable by simple withdrawal. The module 200 thus has a high maintainability. This ease of maintenance of the module 200 authorizes the addition of additional components or the specific replacement of component(s) without implying any assembly complexity, thus giving it a modular character. It is thus possible to target in terms of applications various power ranges, in particular the low and/or average powers.

The invention claimed is:

1. A power electronic module comprising
a plurality of semiconductor power electronic components electrically connected to an electrical support, and
a cooling device in thermal contact with each component, characterized in that
each component is present between the electrical support and the cooling device, and in that
each component is mounted on a first side to the electrical support via at least one electrically conductive spring element, wherein the cooling device exerts a bearing force on each component, and the power electronic module further comprises a positioning frame disposed between the electrical support and the cooling device and comprising through or ices each configured to encompass respectively, one component of the plurality of semiconductor power electronic components and at least one spring, element electrically connecting, the one component of the plurality of semiconductor power electronic components to the electrical support and position a second side of each component for cooling by thermal contact with the cooling device.

2. The module according to claim 1, wherein each component comprises a first side disposed facing the electrical support, said first side including electrodes, and said at least one spring element establishing an electrical connection between at least one of the electrodes and the electrical support.

3. The module according to claim 2, wherein each component comprises a second side opposite the first side, the module further comprising a thermal interface disposed between the cooling device and the second side of each component.

4. The module according to claim 3, wherein said at least one spring element establishes an electrical connection between said at least one of the electrodes and the electrical support comprises a first end brazed to the electrical support.

5. The module according to claim 4, wherein said at least one spring element comprises a second end bearing on said at least one of the electrodes.

6. The module according to claim 1, wherein each component is packaged in an electronic surface-mounted package.

7. The module according to claim 1, wherein said at least one component is a power transistor or a power diode.

8. The module according to claim 1, comprising a power converter formed by a plurality of components.

* * * * *